United States Patent [19]

Okano et al.

[11] Patent Number: 5,498,920
[45] Date of Patent: Mar. 12, 1996

[54] ACOUSTIC WAVE DEVICE AND PROCESS FOR PRODUCING SAME

[75] Inventors: Hiroshi Okano; Naoki Tanaka; Kenichi Shibata; Yusuke Takahashi, all of Moriguchi, Japan

[73] Assignee: Sanyo Electric Co., Ltd., Moriguchi, Japan

[21] Appl. No.: 238,653

[22] Filed: May 5, 1994

[30] Foreign Application Priority Data

May 18, 1993 [JP] Japan ................................. 5-115834

[51] Int. Cl.$^6$ ............................................. H01L 41/08
[52] U.S. Cl. ..................................................... 310/313 A
[58] Field of Search ............................ 310/313 R, 313 A; 333/194, 150

[56] References Cited

U.S. PATENT DOCUMENTS

| | | | |
|---|---|---|---|
| 3,739,290 | 6/1973 | Marshall et al. | 310/313 R X |
| 4,019,200 | 4/1977 | Adkins et al. | 310/313 A |
| 4,189,516 | 2/1980 | Dryburgh et al. | 310/313 A X |
| 4,511,816 | 4/1985 | Mikoshiba et al. | 310/313 A |
| 4,640,756 | 2/1987 | Wang et al. | 310/313 A |
| 4,868,444 | 9/1989 | Shibata et al. | 310/313 A |
| 5,030,930 | 7/1991 | Sugai | 333/150 |
| 5,059,847 | 10/1991 | Tanaka et al. | 310/313 A |

OTHER PUBLICATIONS

Tsubouchi et al., "Zero–Temperature–Coefficient SAW Devices on AlN Epitaxial Films", IEEE Transactions on Sonics and Ultrasonics, vol. SU–32, No. 5, Sep., 1985.

*Primary Examiner*—Mark O. Budd
*Attorney, Agent, or Firm*—Armstrong, Westerman, Hattori, McLeland & Naughton

[57] ABSTRACT

A surface acoustic wave device adapted to attain a higher acoustic velocity than conventionally by realizing SH waves excitable at a higher frequency than the fundametal mode of Rayleigh waves. Aluminum is sputtered for deposition on the R-plane of a sapphire substrate 1 using a sputter ion source, and at the same time, the R-plane of the substrate 1 is irradiated with a nitrogen ion beam having energy of 50 to 250 eV at a current density of 0.2 to 1.0 mA/cm$^2$ using an assist ion source to form an aluminum nitride thin film 2 on the R-plane of the substrate 1 with the [00.1] axis of the film tilted with respect to a normal to the substrate.

4 Claims, 8 Drawing Sheets

5,498,920

ACOUSTIC WAVE DEVICE AND PROCESS FOR PRODUCING SAME

FIELD OF THE INVENTION

The present invention relates to surface acoustic wave devices comprising an aluminum nitride thin film formed on a sapphire substrate and to a process for producing the device.

BACKGROUND OF THE INVENTION

It is generally required that the piezoelectric substrates of surface acoustic wave devices be great in electromechanical coupling coefficient, low in propagation loss and small in the temperature coefficient of delay time.

With communications made at higher frequencies using digital systems in recent years, there is a growing need for surface acoustic wave devices which are usable in the quasi-microwave band. The center frequency $f_0$ of surface acoustic wave devices is expressed by the following equation based on the relationship between the acoustic velocity (phase velocity of the surface acoustic wave) V and the line and space range ($\lambda/4$).

$$f_0 = V/\lambda$$

To provide high-frequency-band surface acoustic devices, therefore, research is conducted on methods of diminishing the line and space range by exquisite fabrication of the electrodes, methods of giving higher acoustic velocities by the development of supersonic materials and methods of giving higher acoustic velocities by the application of harmonic waves or higher modes.

However, in diminishing the line and space range, the accuracy of current lithographic techniques for mass production is about 0.6 μm, so that the center frequency is limited to 1.75 GHz, for example, with surface acoustic wave devices wherein lithium tantalate (acoustic velocity 4200 m/s) is used.

On the other hand, a surface acoustic wave device utilizing a higher mode is proposed which has a ZnO film epitaxially grown on the R-plane of sapphire. It is reported that an acoustic velocity of 5300 m/s can be realized by the proposed device with use of the fundamental wave of so-called Sezawa mode which is a higher mode of Rayleigh waves. The value is the limit for the device.

The present applicant has clarified by computer simulation that piezoelectric substrates having an aluminum nitride film formed on a single crystal silicon substrate can be improved in electromethanical coupling coefficient by inclining the C-axis of the aluminum nitride film with respect to a normal to the silicon substrate (U.S. Pat. No. 5,059,847). Nevertheless, the computer simulation merely analyzes Rayleigh waves and clarifies nothing about realization of harmonic waves or higher modes for giving higher acoustic velocities.

Furthermore, a process for forming an aluminum nitride having a tilted C-axis has been proposed in which an electric field of great strength is applied by DC magnetron sputtering (U.S. Pat. No. 4,640,756). The process, however, has the problem of necessitating a large device for producing the great electric field, and yet the process is unable to realize excitation of harmonic waves or higher modes. Additionally, the aluminum nitride film formed by the process is a polycrystalline oriented film and is therefore inevitably inferior to single-crystal films in characteristics.

SUMMARY OF THE INVENTION

An object of the present invention is to provide the structure of a surface acoustic wave device adapted to achieve a higher acoustic velocity than in the prior art by realizing a mode which is excitable at a higher frequency than the Rayleigh wave.

Another object of the present invention is to provide a process for fabricating a surface acoustic wave device capable of realizing a higher acoustic velocity than conventionally with use of a production apparatus of simple construction.

We have conducted intensive research to accomplish these objects. In the course of the research, we fabricated a surface acoustic wave device using a piezoelectric substrate which was preparing by forming an aluminum nitride thin film on the R-plane of a sapphire substrate under specific conditions. Consequently, we have found that a novel mode of wave can be obtained which has a higher frequency than the Rayleigh wave and which is different from a higher mode of the Rayleigh wave. The present invention has been accomplished based on this finding.

The present invention provides a surface acoustic wave device wherein an aluminum nitride thin film is formed on the R-plane of a sapphire substrate, and the [00.1] axis of the aluminum nitride thin film is tilted with respect to a normal to the substrate. The tilting angle of the [00.1] axis of the aluminum nitride thin film is an optional angle other than 0 deg and 180 deg and is, for example, 24 deg to 28 deg.

Stated more specifically, the surface acoustic wave propagation direction of the device is tilted with respect to the [11.0] axis of the sapphire substrate. The tilting angle of the propagation direction is an optional angle other than 0 deg and 180 deg and is, for example, 15 deg to 75 deg, preferably 45 deg.

The present invention further provides a process for producing the surface acoustic wave device described above which process comprises sputtering aluminum for deposition on the R-plane of a sapphire substrate with use of a sputter ion source and, at the same time, irradiating the R-plane of the sapphire substrate with a nitrogen ion beam having energy of 50 to 250 eV at a current density of 0.2 to 1.0 mA/cm$^2$ with use of an assist ion source to form an aluminum nitride thin film on the R-plane of the sapphire substrate.

With the surface acoustic wave device embodying the present invention, Rayleigh waves having a great electromechanical coupling coefficient can be excited, and at the same time, an excited mode higher than the Rayleigh wave in frequency is produced. Basically, this is attributable to the fact that the piezoelectric direction (C-axis) of the aluminum nitride thin film of the present device is not parallel to the substrate surface. It appears that this fact of non-parallelism results in some specificity.

The surface acoustic wave device of the invention therefore realizes a higher acoustic velocity than those of the prior art wherein excitation of Rayleigh waves is utilized.

Although the excited mode of high frequency according to the present invention still remains to be theoretically explained, it has been substantiated by experiments that the excited mode is reproduced with the probability of 100% by tilting the [00.1] axis of the aluminum nitride thin film with respect to a normal to the sapphire substrate. Although the wave of excited mode may possibly be different from the known SH waves (horizontally polarized shear waves), the wave of excited mode will hereinafter be referred to as an SH wave for the sake of convenience.

The process of the invention for producing the surface acoustic wave device employs a dual ion-beam sputtering apparatus of simple construction which comprises, for example, a Kaufman ion gun as the sputter ion source and an ECR ion gun as the assist ion source, whereby an aluminum nitride thin film can be formed on the R-plane of a sapphire substrate, the aluminum nitride thin film having its [00.1] axis tilted with respect to a normal to the substrate. The substrate thus processed provides a surface acoustic wave device adapted to excite SH waves.

When the aluminum nitride thin film is formed on its surface with a comblike transmitting IDT (interdigital transducer) and a comblike receiving IDT which are so oriented that the surface acoustic wave propagation direction is tilted with respect to the [11.0] axis of the sapphire substrate, the device realizes an increased phase velocity of surface acoustic waves.

DETAILED DESCRIPTION OF EMBODIMENTS

Figure 1:
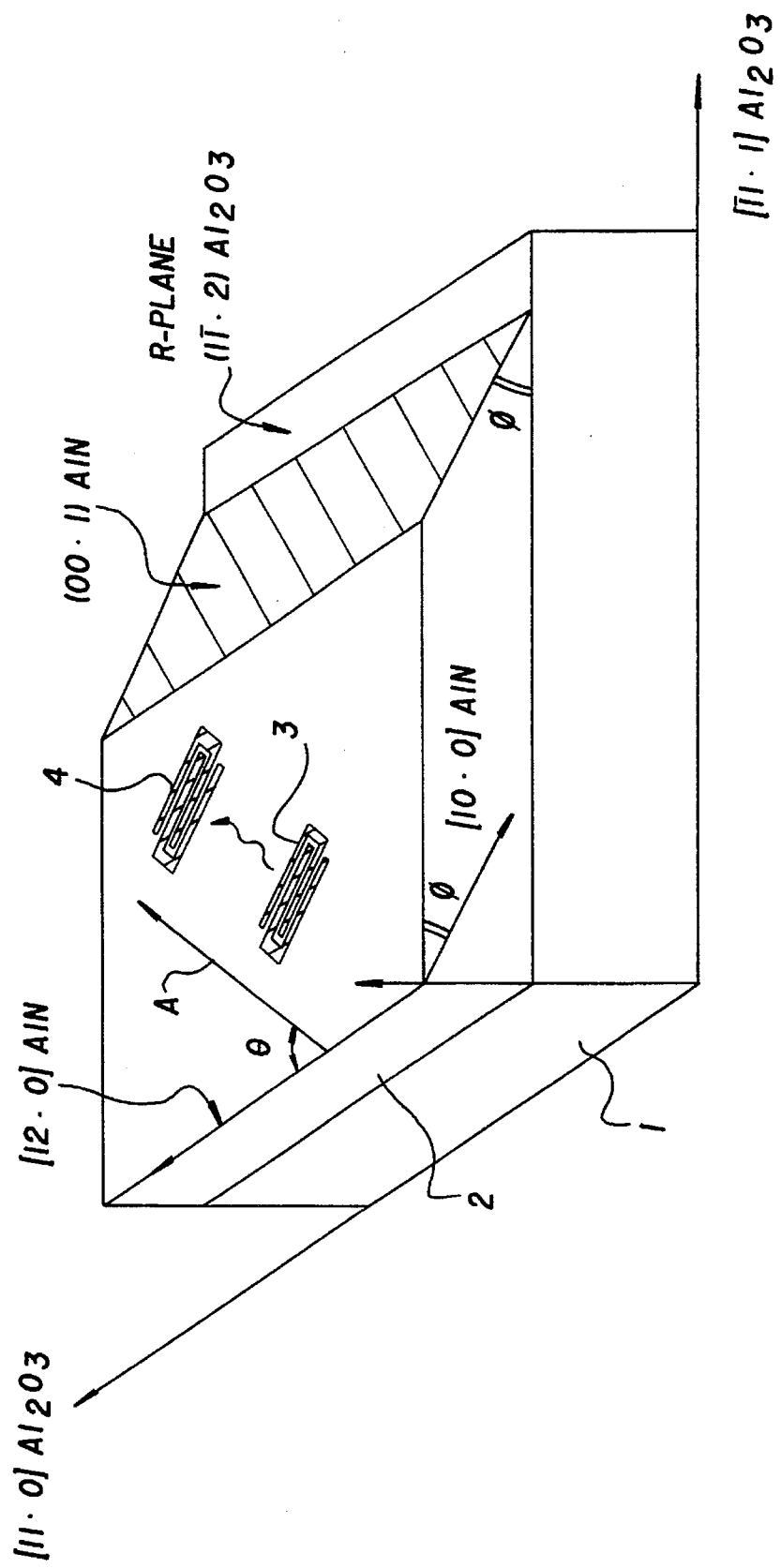
FIG. 1 is a perspective view for illustrating the crystal orientation of a sapphire substrate and an aluminum nitride thin film included in a surface acoustic wave device of the invention.

FIG. 1 shows the crystallographic structures of a sapphire substrate 1 and an aluminum nitride thin film 2 constituting a surface acoustic wave device of the present invention. The thin film 2 is formed on the R-plane of the sapphire substrate 1. The [00.1] plane of the aluminum nitride thin film 2 is tilted at a specified angle ø (e.g., 24 deg to 28 deg) with the surface of the substrate.

Accordingly, the [00.1] axis of the thin film 2 is tilted at an angle, for example, of 24 deg to 28 deg with a normal to the substrate. In other words, the C-axis of the thin film 2, i.e., the piezoelectric direction thereof, is tilted at an angle of 62 deg to 66 deg with the R-plane of the sapphire substrate 1.

As seen in FIG. 1, a comblike transmitting IDT 3 and a comblike receiving IDT 4 are to be arranged on the surface of the aluminum nitride thin film 2 in a direction A tilted at a specified angle θ (15 deg to 75 deg, preferably 45 deg) with the [11.0] axis of the sapphire substrate 1, i.e., with the [12.0] axis of the thin film 2 in the illustrated case.

In expressing angles for designating the orientations of crystal axes, two directions different from each other by 180 deg are considered to be identical in characteristics elastodynamically and crystallographically, so that angles in the range of 0 deg to 180 deg will be representavitly used in the description of the present embodiment.

Figure 2:
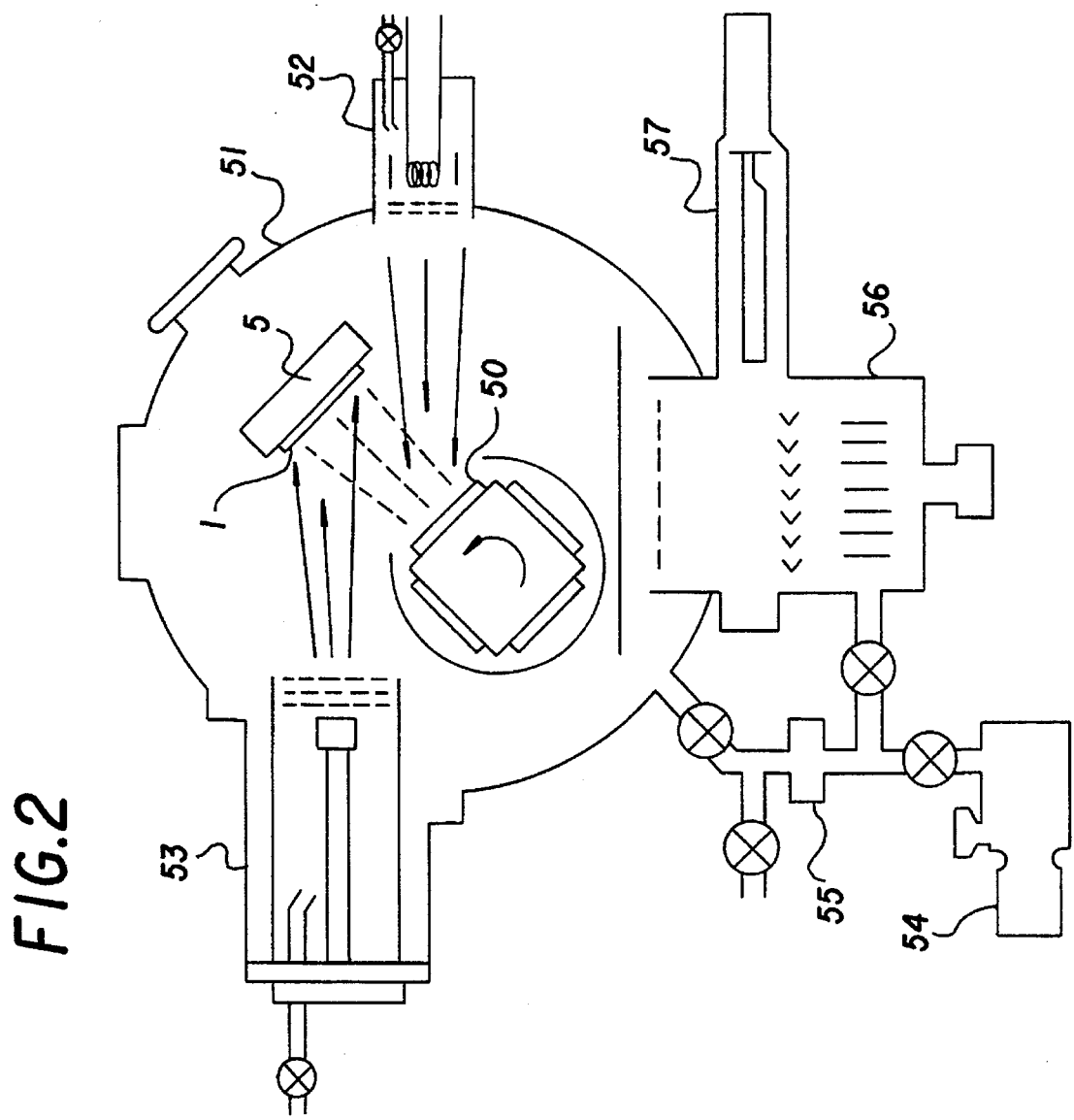
FIG. 2 is a diagram schematically showing the construction of a dual ion-beam sputtering apparatus for use in forming the aluminum nitride thin film.

FIG. 2 shows a dual ion-beam sputtering apparatus constructed for forming the aluminum nitride thin film 2 having the above crystal orientation on the R-plane of the sapphire substrate 1.

As is well known, the sputtering apparatus comprises a rotary pump 54, turbo pump 55, cryo pump 56, main valve 57, etc. which are connected to a chamber 51. The sapphire substrate 1 is fixed to a substrate holder 5 inside the chamber 51. An aluminum target 50 is disposed as opposed to the substrate.

In construction, the dual ion-beam sputtering apparatus is characterized by a Kaufman ion gun 52 used as a sputter ion source, and an ECR ion gun 53 serving as an assist ion source. When the frequency (2.45 GHz) of microwaves is made to match the frequency of circular motions of electrons in a magnetic field (875 gauss) in the ECR ion gun 53, electron cycrotron resonance (ECR) occurs, producing a plasma of high density.

The aluminum target 50 is sputtered with an argon ion beam from the Kaufman ion gun 52, and at the same time, the sapphire substrate 1 is irradiated with a nitrogen ion beam from the ECR ion gun 53, whereby an aluminum nitride thin film is formed on the sapphire substrate 1.

Figure 8:
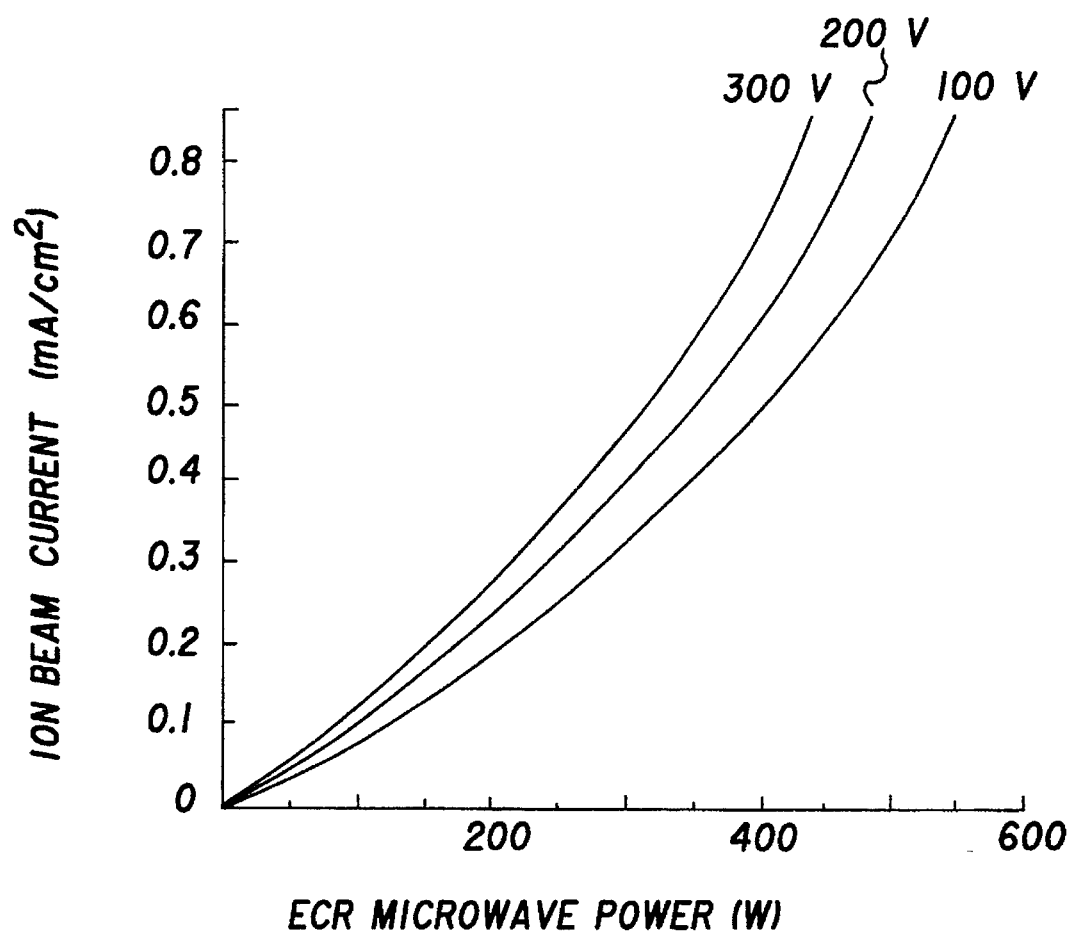
FIG. 8 is a graph showing the characteristics of an ECR ion gun.

FIG. 8 shows the characteristics of the ECR ion gun 53 at accelerating voltages of 100 V, 200 V and 300 V. As shown in the graph, the amount and energy of the nitrogen ion beam can be altered as desired by varying the microwave power and the accelerating voltage.

In forming the aluminum nitride thin film, the substrate is maintained at a temperature of at least 200° C., and the argon ion beam from the Kaufman ion gun 52 is set for energy of 500 to 800 eV at 30 to 60 mA to feed aluminum to the substrate at a rate of 20 to 100 angstroms/min.

Simultaneously with this, the microwave power of the ECR ion gun 53 is set to 200 to 600 W, and the substrate is irradiated with a nitrogen ion beam having energy of 50 to 250 eV at a current density of 0.2 to 1.0 mA/cm$^2$ for assistance.

The backpround pressure is set to not higher than $5 \times 10^{-7}$ torr, and the film deposition pressure to $5.0 \times 10^{-5}$ to $5.0 \times 10^{-4}$ torr.

Figure 11:
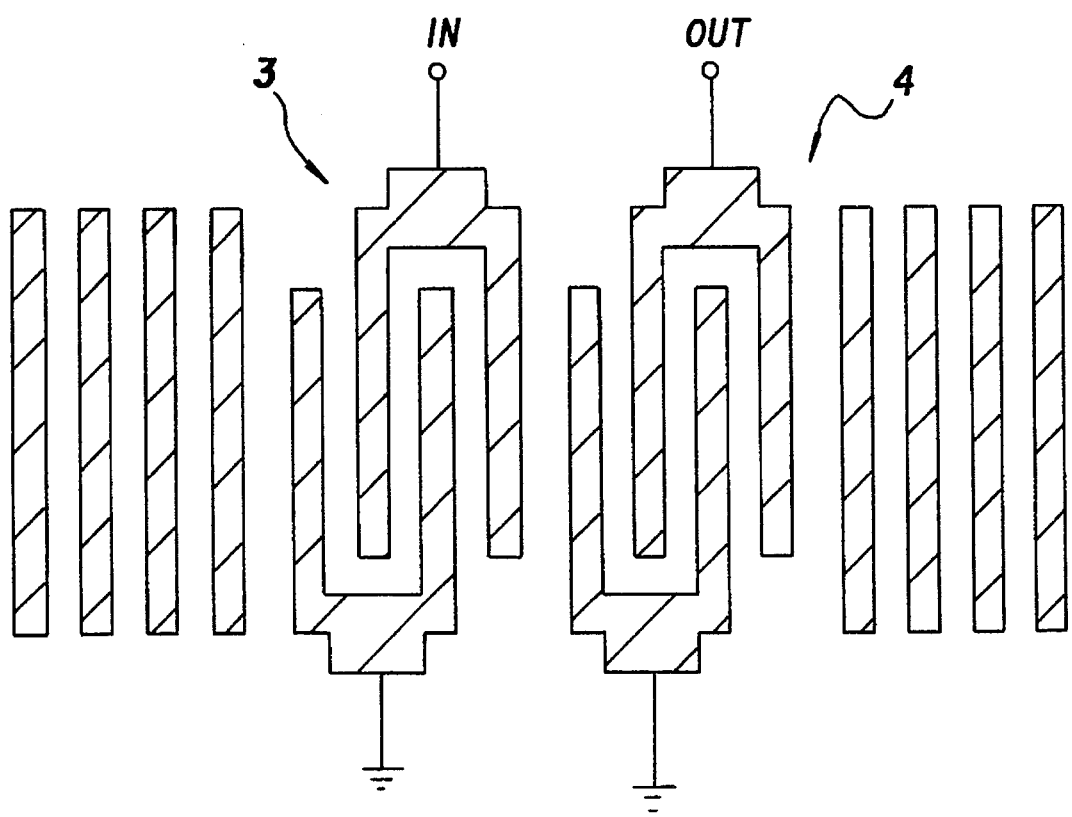
FIG. 11 is a plan view showing the patterns of a transmitting IDT and a receiving IDT.

The comblike transmitting IDT 3 and receiving IDT 4 shown in FIG. 11 were formed on the surface of the aluminum nitride thin film 2 prepared by the above process of the invention to fabricate a resonator-type filter, which was then checked for transmission characteristics by a network analyzer.

Four kinds of such resonator-type filters, which were different in characteristics as will be described later, were fabricated according to the present invention, and compared in respect of characteristics with a resonator-type filter having an aluminum nitride thin film 2 on the C-plane of a sapphire substrate 1.

The films formed were checked by XRD (X-ray diffraction) and XPS (X-ray photo-electron spectroscopy) for the phase produced, by RHEED (reflection high energy electron diffraction) for the crystal orientation and by SEM (scanning electron microscopy) for surface morphology.

First, an aluminum nitride thin film 2, 4000 angstroms in thickness, was formed, with the microwave power set to 300 W, the nitrogen ion beam to energy of 50 to 200 eV, preferably 80 to 120 eV, more preferably 100 eV, and to a current of 26 mA (corresponding to a current per unit area of 0.32 mA/cm$^2$), the substrate to a temperature of 800° C., and the rate of feed of aluminum by the Kaufman ion gun 52 to 40 angstroms/min.

Incidentally, the evaluation of crystallinity of the aluminum nitride thin film by RHEED indicated that the optimum value of energy of the nitrogen ion beam was 100 eV.

The comblike transmitting IDT 3 and the comblike receiving IDT 4 were formed with a pattern pitch of 1.01 μm.

Observation of the aluminum nitride thin film 2 by RHEED revealed that the film was an epitaxially grown single crystal and had its [00.1] axis tilted at an angle of 26±2 deg with a normal to the substrate.

Figure 3:
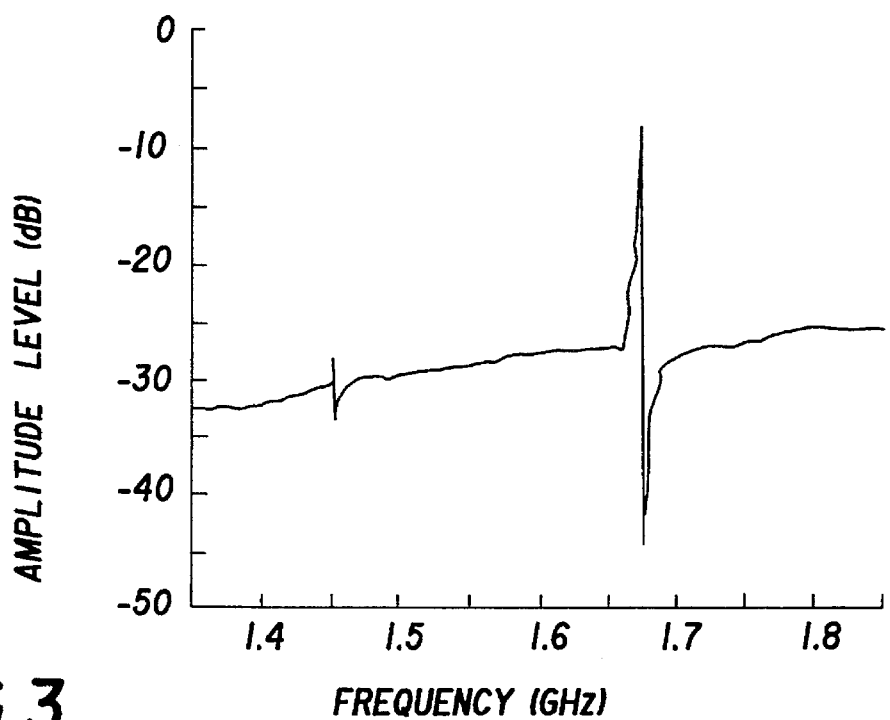
FIG. 3 is a waveform diagram showing the frequency response of a surface acoustic wave device of the invention wherein the surface acoustic wave propagation direction is tilted at an angle of 45 deg with the [11.0] axis of the sapphire substrate.

In the case of the above filter, the fundamental mode of Rayleigh waves is observed around 1.45 GHz, and SH waves around 1.67 GHz as shown in FIG. 3. In this case, the surface acoustic wave phase velocity, i.e., acoustic velocity, is as high as about 6680 m/sec as calculated from the IDT pattern pitch.

The fundamental mode at about 1.45 GHz involves an insertion loss of more than 20 dB, which is not satisfactory for acutual use in the high-frequency band. For the SH wave around 1.67 GHz, on the other hand, the insertion loss and the suppression are 6 dB and 20 dB, respectively, which are useful levels.

Next, an aluminum nitride thin film 2 having a thickness of 3000 angstroms was formed with the energy of the nitrogen ion beam from the ECR ion gun 53 altered to 100 eV and the beam current to 60 mA (current per unit area 0.74 mA/cm$^2$). The transmitting IDT 3 and receiving IDT 4 were formed with a pitch pattern of 1.39 μm.

Figure 4:
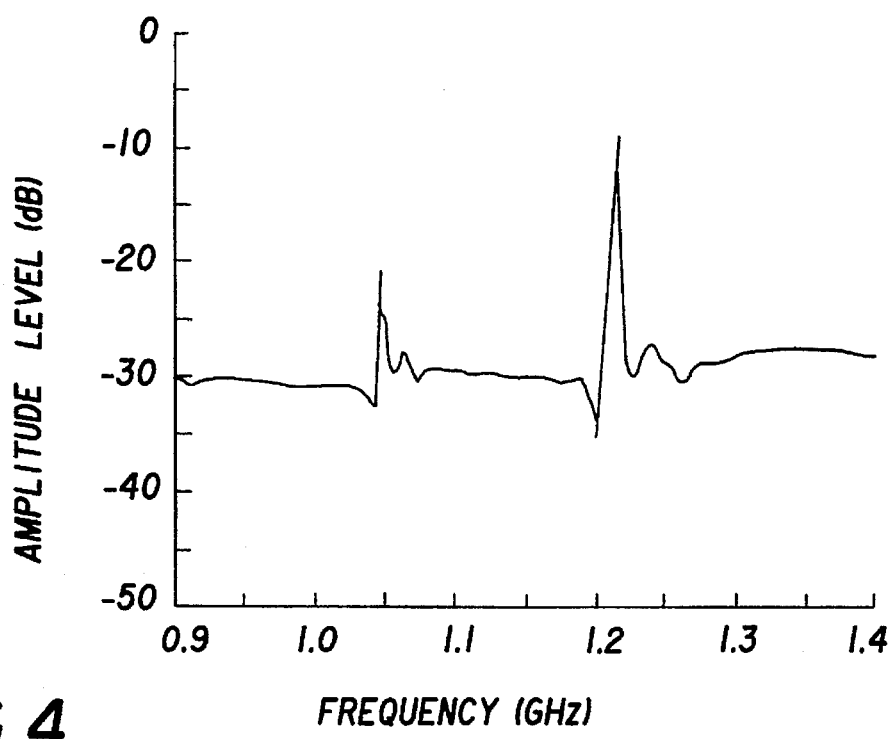
FIG. 4 is a waveform diagram showing the frequency response of another surface acoustic wave device.

With this filter, the fundamental mode of Rayleigh waves is observed at about 1.04 GHz, and SH waves at about 1.20 GHz as seen in FIG. 4. The characteristics of the SH waves are found useful in the high-frequency band as in the above case.

Figure 5:
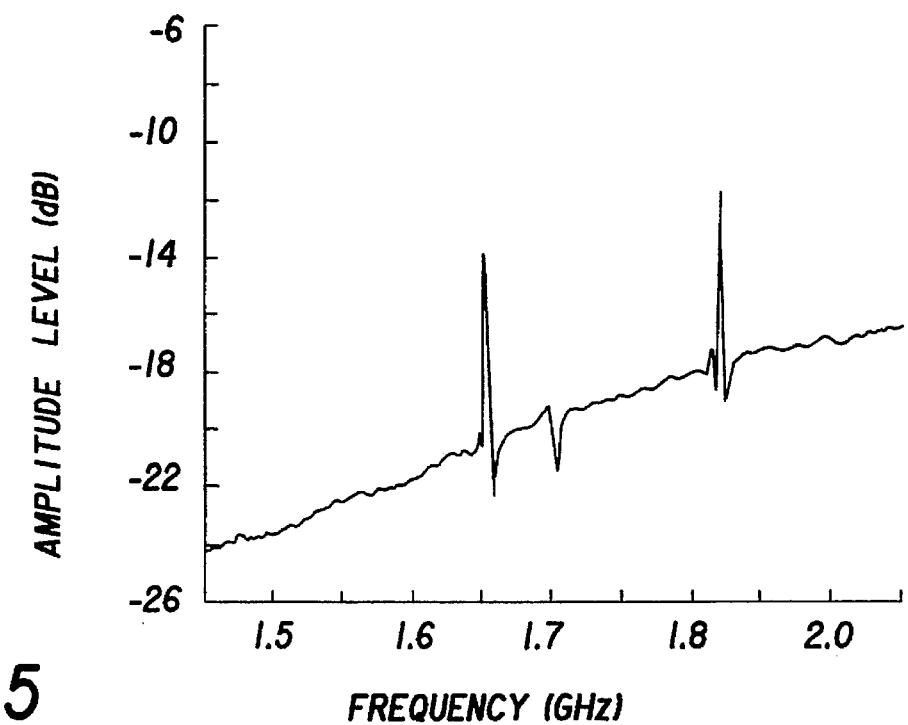
FIG. 5 is a waveform diagram obtained in the case where the propagation direction is tilted at an angle of 30 deg with the [11.0] axis of the sapphire substrate.
Figure 6:
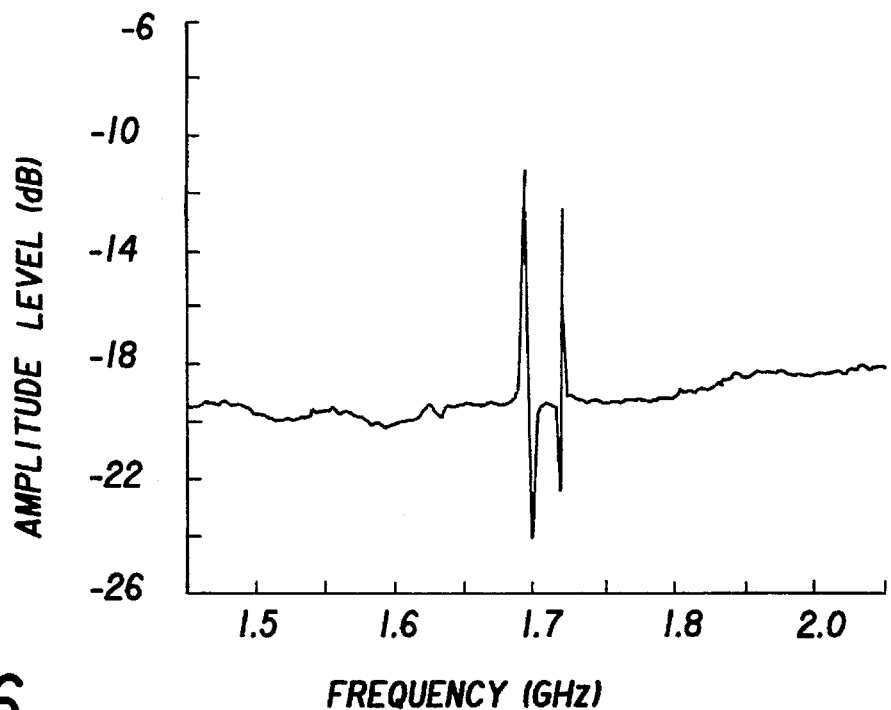
FIG. 6 is a waveform diagram obtained in the case where the tilting angle is 15 deg.

FIGS. 5 and 6 show the frequency response obtained with surface acoustic wave devices each having an IDT pattern pitch of 0.88 μm. The tilting angle θ of the surface acoustic wave propagation direction with respect to the [11.0] axis of the sapphire substrate 1 is set to 30 deg in the case of FIG. 5 or to 15 deg in the case of FIG. 6.

In the case of FIG. 5, the fundamental mode of Rayleigh waves is observed around 1.65 GHz, and SH waves around 1.82 GHz. In the case of FIG. 6, the fundamental mode of Rayleigh waves is found around 1.69 GHz, and SH waves around 1.72 GHz.

As will be apparent from FIGS. 5 and 6, SH waves are excited regardless of the tilting angle of the propagation direction with respect to the [11.0] axis of the sapphire substrate 1, and the frequency of the SH waves approaches the frequency of the fundamental mode of Rayleigh waves as the tilting angle decreases.

Figure 7:
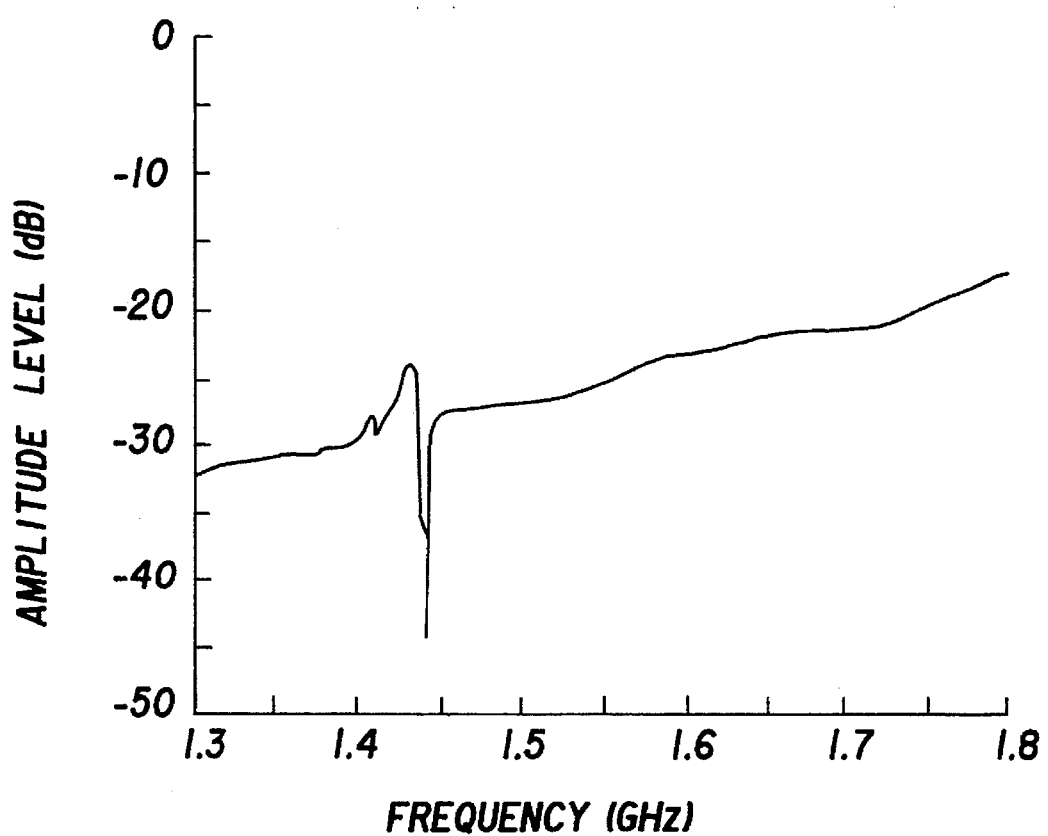
FIG. 7 is a waveform diagram showing the frequency response of a similar device wherein the aluminum nitride thin film is formed on the C-plane of sapphire.

Unlike the filters embodying the invention and described above, the resonator-type filter wherein the aluminum nitride thin film 2 is formed on the C-plane of the sapphire substrate exhibits the characteristics of FIG. 7, which shows Rayleigh waves only around 1.45 GHz but no SH wave.

Figure 9:
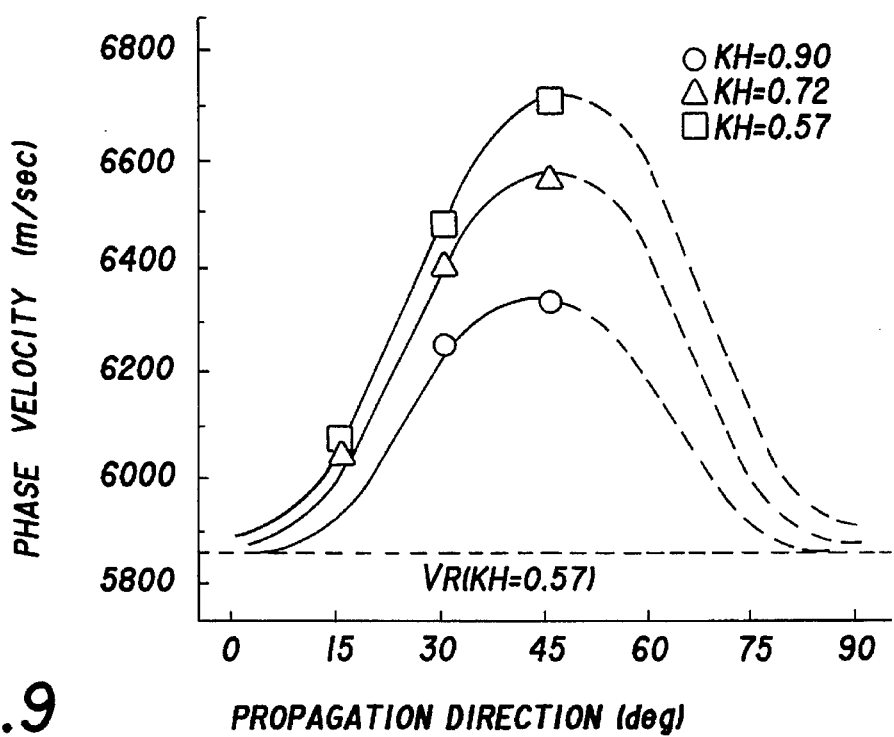
FIG. 9 is a graph showing the relationship between the phase velocity and the wave propagation direction with respect to the [11.0] axis of the sapphire substrate.

FIG. 9 shows the relationship between the tilting angle θ of the surface acoustic wave propagation direction and the phase velocity as established by surface acoustic wave devices embodying the invention and varying in the thickness of the aluminum nitride thin film 2.

The parameter KH given in the graph is defined by the following equation using the wavelength λ and the film thickness H.

KH=2πH/λ

FIG. 9 reveals that the phase velocity is maximum when the tilting angle of the propagation direction is 45 deg, and decreases as the tilting angle diminishes. The broken lines in FIG. 9 represent speculations made in view of crystallographic symmetry.

Figure 10:
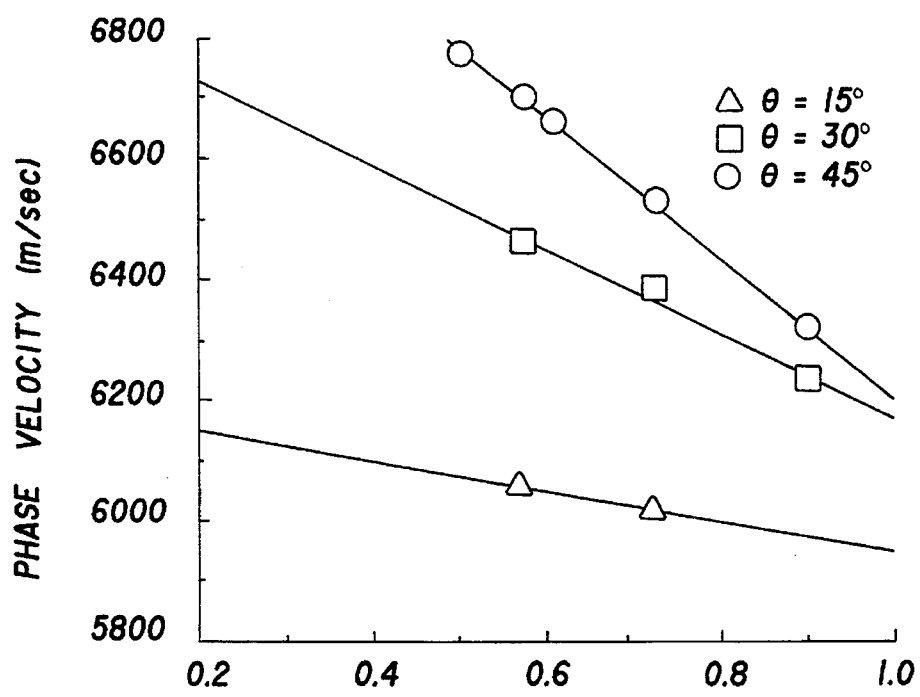
FIG. 10 is a graph showing the relationship between the thickness of the aluminum nitride thin film and the phase velocity.

FIG. 10 shows the relationship between the parameter KH and the phase velocity when the propagation direction is tilted at varying angles θ. The graph indicates that the phase velocity increases with a decrease in the parameter KH, i.e., with a decrease in the film thickness. Although the aluminum nitride thin film 2 has a thickness of 4000 angstroms with the foregoing embodiment, it is desired that the film thickness be as small as possible in realizing higher phase velocities.

As described above, the surface acoustic wave device embodying the present invention is adapted to excite SH waves having a higher frequency than Rayleigh waves to realize a higher phase velocity. The TCD (temperature coefficient of delay) for SH waves is about 20% smaller than is the case with the fundamental mode and can be reduced to up to 35 ppm/°C.

The piezoelectric substrate prepared by the process of the invention was further found to be excellent in surface smoothness when observed by SEM, and it was found possible to minimize the propagation loss.

Accordingly, the surface acoustic wave device of the present invention is adavantageous for providing communication devices or apparatus for use at higher frequencies or incorporating digital systems.

The foregoing description of the embodiment is given for illustrating the present invention and should not be interpreted as limiting the invention defined in the appended claims or reducing the scope thereof. The construction of the present device is not limited to that of the embodiment but can of course be modified variously within the technical scope as defined in the claims.

For example, the aluminum nitride thin film 2 is not limited to the one shown in FIG. 1 in orientation but can be oriented as rotated about a normal to the substrate through a desired angle, insofar as the [00.1] axis is held in a tilted position. The advantages of the invention are available also in this case.

What is claimed is:

1. A surface acoustic wave device, comprising:

a sapphire substrate having an R-plane; and an aluminum nitride thin film, wherein said aluminum nitride thin film is formed on the R-plane of said sapphire substrate, wherein the [00.1] axis of the aluminum nitride thin film is tilted with respect to a normal to the substrate, and wherein a propagation direction of surface acoustic waves is tilted with respect to the [11.0] axis of the sapphire substrate.

2. A surface acoustic wave device as defined in claim 1, wherein the [00.1] axis of the aluminum nitride thin film is tilted at an angle of between 24 degrees and 26 degrees with respect to the normal to the substrate.

3. A surface acoustic wave device as defined in claim 1, wherein the propagation direction of the surface acoustic waves is tilted at an angle of between 15 degrees and 75 degrees with respect to the [11.0] axis of the sapphire substrate.

4. A surface acoustic wave device as defined in claim 3 wherein the propagation direction of the surface acoustic waves is tilted at an angle of 45 degrees with respect to the [11.0] axis of the sapphire substrate.

* * * * *